US008729381B2

(12) United States Patent
Yang et al.

(10) Patent No.: US 8,729,381 B2
(45) Date of Patent: May 20, 2014

(54) NANOSTRUCTURES HAVING HIGH PERFORMANCE THERMOELECTRIC PROPERTIES (75) Inventors: Peidong Yang, Kensington, CA (US); Arunava Majumdar, Orinda, CA (US); Allon I. Hochbaum, Cambridge, MA (US); Renkun Chen, San Diego, CA (US); Raul Diaz Delgado, Mostoles (ES)

(73) Assignee: The Regents of The University of California, Oakland, CA (US)

( * ) Notice: Subject to any disclaimer, the term of this patent is extended or adjusted under 35 U.S.C. 154(b) by 1091 days.

(21) Appl. No.: 12/673,366

(22) PCT Filed: Aug. 21, 2008

(86) PCT No.: PCT/US2008/073922
§ 371 (c)(1),
(2), (4) Date: Jan. 12, 2011

(87) PCT Pub. No.: WO2009/026466
PCT Pub. Date: Feb. 26, 2009

(65) Prior Publication Data
US 2011/0114145 A1    May 19, 2011

Related U.S. Application Data (60) Provisional application No. 60/957,158, filed on Aug. 21, 2007, provisional application No. 61/016,276, filed on Dec. 21, 2007.

(51) Int. Cl.
*H01L 35/28* (2006.01)
*H01L 35/14* (2006.01)
*H01L 35/20* (2006.01)

(52) U.S. Cl.
USPC ............ 136/239; 136/203; 136/204; 977/932

(58) Field of Classification Search
USPC .............. 136/203, 204, 205, 211, 212, 236.1, 136/239; 977/932
See application file for complete search history.

(56) References Cited

U.S. PATENT DOCUMENTS 4,251,286 A * 2/1981 Barnett .......................... 136/260
6,882,051 B2    4/2005 Majumdar et al.
(Continued)

FOREIGN PATENT DOCUMENTS

| CN | 101009214 | 8/2007 |
| JP | 2004-532133 | 10/2004 |

(Continued)

OTHER PUBLICATIONS

Zhang et al., Synthesis of ordered single crystal silicon nanowire arrays, Adv. Mater. 13, 1238 (2001).*

(Continued)

*Primary Examiner* — Eli Mekhlin
(74) *Attorney, Agent, or Firm* — Weaver Austin Villeneuve & Sampson LLP (57) ABSTRACT The invention provides for a nanostructure, or an array of such nanostructures, each comprising a rough surface, and a doped or undoped semiconductor. The nanostructure is an one-dimensional (1-D) nanostructure, such a nanowire, or a two-dimensional (2-D) nanostructure. The nanostructure can be placed between two electrodes and used for thermoelectric power generation or thermoelectric cooling.

24 Claims, 8 Drawing Sheets

(56) References Cited

U.S. PATENT DOCUMENTS

| | | | |
|---|---|---|---|
| 6,996,147 B2 | 2/2006 | Majumdar et al. | |
| 2003/0041892 A1 | 3/2003 | Fleurial et al. | |
| 2004/0000333 A1 | 1/2004 | Chen et al. | |
| 2005/0045702 A1* | 3/2005 | Freeman et al. | 228/254 |
| 2006/0118158 A1 | 6/2006 | Zhang et al. | |
| 2006/0233692 A1 | 10/2006 | Scaringe et al. | |

FOREIGN PATENT DOCUMENTS

| | | |
|---|---|---|
| WO | 02/080280 | 10/2002 |
| WO | 2006/062582 | 6/2006 |

OTHER PUBLICATIONS

Disalvo, F. J., Thermoelectric cooling and power generation, Science, 285 703-706 (1999).*

WO patent application No. PCT/US08/73922, International Search Report mailed Dec. 23, 2008.

Li, D. et al., "Thermal conductivity of individual silicon nanowires", Appl. Phys. Lett. 83, 2934-2936 Oct. 6, 2003.

Weber, L. & Gmelin, E., "Transport properties of silicon", Appl. Phys. A 53, 136-140 Mar. 1, 1991.

Peng et al., "Synthesis of large-area silicon nanowire arrays via self-assembling nanochemistry", Adv. Mater. 14, 1164-1167 Aug. 16, 2002.

Peng et al., "Dendrite-assisted growth of silicon nanowires in electroless metal deposition", Adv. Funct. Mater. 13, 127-132 Feb. 2003.

Peng et al., "Uniform, axial-orientation alignment of one-dimensional single-crystal silicon nanostructure arrays", Angew. Chem. Int. Edit. 44, 2737 (2005) Dec. 20, 2004.

Peng et al., "Aligned single-crystalline Si nanowire arrays for photovoltaic applications", small, 1(11): 1062-1067 Apr. 26, 2005.

A. Tao, F. Kim, C. Hess, J. Goldberger, R. He, Y. Sun, Y. Xia, P. Yang, "Langmuir-Blodgett silver nanowire monolayers for molecular sensing using surface-enhanced raman spectroscopy", Nano. Lett. 3, 1229, Jun. 18, 2003.

Asheghi, M., Leung, Y.K., Wong, S.S. & Goodson, K.E. "Phonon-boundary scattering in thin silicon layers", Appl. Phys. Lett. 71, 1798-1800 (1997) Sep. 29, 2007.

Asheghi, M., Touzelbaev, Goodson, K.E., Leung, Y.K. & Wong, S.S., "Temperature-dependent thermal conductivity of single crystal silicon layers in SOI substrates", J.Heat Transf. 120, 30-36 Feb. 1998.

Ju, Y.S. & Goodson, K.E., "Phonon scattering in silicon films with thickness of order 100 nm.", Appl. Phys. Lett. 74 3005-0337 May 17, 1999.

Hochbaum, A.I., Fan, R., He, R. & Yang, P. "Controlled growth of Si nanowire arrays for device integration", Nano Lett. 5, 457-460 (2005) Dec. 3, 2004.

Shi, L., et al., "Measuring thermal and thermoelectric properties of one-dimensional nanostructures using a microfabricated device", J. Heat Transf. 125, 881-888 Oct. 2003.

Majumdar, A., "Thermoelectricity in semiconductor nanostructures", Science 303 777-778 Feb. 6, 2004.

Hsu, K.F. et al. "Cubic AgPb$_m$SbTe$_{2+m}$: bulk thermoelectric materials with high figure of merit", Science 303, 818-821 Feb. 6, 2004.

Harman, T.C., Taylor, P.J., Walsh, M.P. & LaForge, B.E., "Quantum dot superlattice thermoelectric materials and evices", Science 297, 2229-2232 Sep. 27, 2002.

Venkatasubramanian, R., Siivola, E., Colpitts, T. & O'Quinn, B. "Thin-film thermoelectric devices with high room-temperature figures of merit", Nature 413 597-602 Oct. 11, 2001.

Kim, W. et al., "Thermal conductivity reduction and thermoelectric figure of merit increase by embedding nanoparticles in crystalline semiconductors", Phys. Rev. Lett. 96, 045901-1-045901-4 Feb. 3, 2006.

Zou, J. & Balandin, A., "Phonon heat conduction in a semiconductor", Nanowire. J. App. Phys. 89, 2932-2938 Mar. 1, 2001.

Brinson, M.E. & Dunstan, W., "Thermal conductivity and thermoelectric power of heavily doped n-type silicon", J. Phys. C 3, 483-491 (1970) Jul. 18, 1969.

Ruf, T. et al., "Thermal conductivity of isotopically entriched silicon", Solid State Commun. 115, 243-247 Mar. 17, 2000.

Cahill, D.G. & Pohl, R.O., "Thermal conductivity of amorphous solids above the plateau", Phys. Rev. B 35, 4067-4073 Mar. 15, 1987.

Geballe, T.H. & Hull, G.W., "Seebeck effect in silicon", Phys. Rev. 98, 940 May 15, 1955.

Van Herwaarden, A.W., "The seebeck effect in silicon Ics.", Sensors and Actuators, 6, 245-254 Jun. 5, 1984.

JP patent application No. 2010-522040, Office Action mailed Mar. 5, 2013.

CN patent application No. 200880113050.3, Office Action mailed Oct. 24, 2011.

CN patent application No. 200880113050.3, Office Action mailed Sep. 5, 2012.

CN patent application No. 200880113050.3, Office Action mailed Mar. 5, 2013.

RU patent application No. 2010110307/04, Office Action mailed Jun. 1, 2012.

EP patent application No. 08827590, Supplemental Search Report mailed Aug. 5, 2013.

EP patent application No. 10163141, Search Report mailed Aug. 20, 2013.

JP patent application No. 2010-522040, Notice of Allowance mailed Mar. 11, 2014.

* cited by examiner

NANOSTRUCTURES HAVING HIGH PERFORMANCE THERMOELECTRIC PROPERTIES

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

FIELD OF THE INVENTION

This invention relates generally to nanostructures.

BACKGROUND OF THE INVENTION

Currently, approximately 90 percent of the world's power (~$10^{13}$ Watts or 10 TW) is generated by heat engines that use fossil fuel combustion as a heat source and typically operate at 30-40 percent efficiency, such that roughly 15 TW of heat is lost to the environment. Thermoelectric modules can potentially convert this low-grade waste heat to electricity, which could result in significant fuel savings and reduction in carbon emissions. Their efficiency depends on the thermoelectric figure of merit (ZT) of their material components, which is defined as $ZT=S^2\sigma T/k$ where S, $\sigma$, k, and T are the Seebeck coefficient, electrical conductivity, thermal conductivity and absolute temperature, respectively. Over the past five decades, however, it has been challenging to increase ZT>1, since the parameters of ZT are generally interdependent. Nanostructured thermoelectric materials based on compounds of Bi, Te, Pb, Sb, and Ag have already been shown to increase ZT>1.

U.S. Pat. Nos. 6,882,051 and 6,996,147 disclose one-dimensional nanostructures having uniform diameters of less than approximately 200 nm. These nanostructures include single-crystalline homostructures as well as heterostructures of at least two single-crystalline materials having different chemical compositions.

SUMMARY OF THE INVENTION

The invention provides for a novel nanostructure comprising a rough surface, wherein the nanostructure comprises a doped or undoped semiconductor.

The invention also provides for a device comprising a nanostructure comprising a rough surface, wherein the nanostructure comprises a doped or undoped semiconductor and the nanostructure contacts a first electrode and a second electrode.

The invention also provides for a method of creating an electric current comprising: providing a device of the present invention, and setting up a temperature gradient between the first and second electrodes, such that an electric current is created that flows from the first electrode to the nanostructure, and through the nanostructure to the second electrode.

The invention further provides for a device comprising: a first electrode; a second electrode; a third electrode; a first plurality of nanostructures each comprising a rough surface, wherein each nanostructure comprises Si, Ge, or a combination thereof, doped with a valence-three element (such that the nanostructure comprises a p-type semiconductor); and, a second plurality of nanostructures each comprising a rough surface, wherein the nanostructure comprises Si, Ge, or a combination thereof, doped with a valence-five element (such that the nanostructure comprises a n-type semiconductor); wherein the first plurality of nanostructures contacts the first electrode and the third electrode, the second plurality of nanostructures contacts the first electrode and the second electrode; such that when the first electrode has a higher temperature than the second and third electrodes an electric current is created that flows from the second electrode to the second plurality of nanostructures, through the second plurality of nanostructures to the first electrode, through first electrode to the first plurality of nanostructures, through the first plurality of nanostructures to the third electrode.

The invention further provides for a method of creating an electric current comprising: providing the device of the present invention having a first plurality of nanostructures and a second plurality of nanostructures, and increasing the temperature of the first electrode; such that an electric current is created that flows from the second electrode to the second plurality of nanostructures, through the second plurality of nanostructures to the first electrode, through first electrode to the first plurality of nanostructures, through the first plurality of nanostructures to the third electrode.

The invention also provides for a method of decreasing the temperature of a locality comprising providing a device of the present invention, and applying an electric current through the device; such that the temperature of the first electrodes is decreased, wherein the first electrode is at or near the locality, and the temperature of the second and third electrodes is increased.

BRIEF DESCRIPTION OF THE DRAWINGS

The foregoing aspects and others will be readily appreciated by the skilled artisan from the following description of illustrative embodiments when read in conjunction with the accompanying drawings.

FIG. 1 shows the structural characterization of the rough silicon nanowires. Panel A shows the cross-sectional SEM of an EE Si nanowire array. Dendritic Ag growth can be seen within the array—a product of $Ag^+$ reduction onto the wafer during reaction. The Ag is etched in nitric acid following the synthesis and elemental analysis confirms it is dissolved completely. Panel B shows the bright field TEM image of a segment of an EE Si nanowire. The roughness is clearly seen at the surface of the wire. The SAED pattern (inset) indicates that the wire is single crystalline all along its length. Panel C shows the HRTEM image of an EE Si nanowire. The roughness is evident at the interface between the crystalline Si core and the amorphous native oxide at the surface, and by undulations of the alternating light/dark thickness fringes near the edge. Panel D shows the HRTEM of a VLS-grown Si nanowire. Scale bars are 10 μm, 20 nm, 4 nm, and 3 nm, respectively.

FIG. 2 shows the thermal conductivity of the rough silicon nanowires. Panel A shows a SEM image of a Pt-bonded EE Si nanowire (taken at 52° tilt angle). The Pt thin film loops near both ends of the bridging wire are part of the resistive heating and sensing coils on opposite suspended membranes. Scale bar is 2 μm. Panel B shows the temperature-dependent k of VLS (reproduced from Li, D. et al. Thermal conductivity of individual silicon nanowires. *Appl. Phys. Lett.* 83, 2934-2936 (2003)) and EE nanowires (indicated solid squares). The peak k of the VLS nanowires is around 175-200 K, while that of the EE nanowires is above 250 K. The data in this graph are from EE nanowires synthesized from low-doped wafers. Panel C shows the temperature-dependent k of EE Si nanowires of different dopant densities: $10^{14}$ and $10^{18}$ $cm^{-3}$ (indicated solid squares). For the purpose of comparison, the k of bulk amorphous silica is plotted with open squares. The smaller highly doped EE Si nanowires have a k approaching that of insulating glass, suggesting an extremely short phonon mean free path.

FIG. 3 shows the figure of merit estimation for the rough silicon nanowire. Panel A shows the ratio of bulk k to that of a highly doped EE Si nanowire 75 nm in diameter. $k_{bulk}$:$k_{NW}$ increases dramatically with decreasing temperature, from 100 at 300 K to almost 40,000 at 25 K. Panel B shows the ZT calculated for the 75 nm highly doped EE nanowire as compared to ZT extracted from degenerately doped bulk Si data in Weber, L. & Gmelin, E. Transport properties of silicon. *Appl. Phys. A* 53, 136-140 (1991).

FIG. 4 shows the nanowire FIB bonding and control experiments. Panel A shows the TEM image of Pt—C excess deposition on the nanowire away from the irradiated region. The deposition adds thickness to the diameter of the wire as seen in the SEM, so all calculations were based on the diameter determined before Pt bonding. Scale bar is 10 nm. Panel B shows the thermal conductance of an EE Si nanowire after first bonding with Pt in the FIB (solid squares). The sample broke near one of the pads and was re-bonded at the ends with significant Pt—C deposition over the gap. The conductance measurement after this second bonding (open squares) coincides with the first measurement. Hence, the Pt deposition at the wire ends is a good thermal anchor, but does not contribute significantly to thermal conduction along the wire. Panel C shows the k of 197 and 257 nm $SiO_2$ nanowires (open squares and open triangles, respectively) compare quantitatively to that of bulk $SiO_2$ (solid squares).

FIG. 5 shows the electrical transport measurements. The nanowires are shown by the hatched rectangles. Panel A shows the resistivity of the As-doped Si (100) wafer used for synthesis of the highly doped EE Si nanowires. Panel B shows the Seebeck coefficient of the As-doped Si (100) wafer used for synthesis of the highly doped EE Si nanowires.

DETAILED DESCRIPTION

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a nanowire" includes a plurality of such nanowires, and so forth.

These and other objects, advantages, and features of the invention will become apparent to those persons skilled in the art upon reading the details of the invention as more fully described below.

The Nanostructure

The nanostructure of the present invention comprises a rough surface, wherein the nanostructure comprises any suitable doped or undoped semiconductor; with the provisio that the nanostructure is not a silicon nanowire prepared by immersing cleaned p-type (111)-oriented silicon substrates into an aqueous HF/$AgNO_3$ solution for 20 minutes at 50° C., such as the silicon nanowires described in Peng, et al., Synthesis of large-area silicon nanowire arrays via self-assembling nanochemistry. *Adv. Mater.* 14, 1164-1167 (2002); Peng, et al., Dendrite-assisted growth of silicon nanowires in electroless metal deposition. *Adv. Funct. Mater.* 13, 127-132 (2003); and Peng, et al. Uniform, axial-orientation alignment of one-dimensional single-crystal silicon nanostructure arrays. *Angew. Chem. Int. Edit.* 44, 2737 (2005). The nanostructure of the present invention comprises the following characteristics: confinement and surface engineering (or interface engineering).

The invention also provides for a device comprising a nanostructure comprising a rough surface, wherein the nanostructure comprises a doped or undoped semiconductor and the nanostructure contacts a first electrode and a second electrode. In some embodiments, the device comprises one or more nanostructures, wherein each nanostructure contacts a first electrode and a second electrode.

The nanostructure is one-dimensional (1-D), or two-dimensional (2-D).

The definition of "confinement" is that the nanostructure is one-dimensional (1-D) or two-dimensional (2-D), and has at least one dimension that is limited from 1 nm to 1,000 nm in length. The 1-D nanostructures include, but are not limited to, nanowires. The 2-D nanostructures include, but are not limited to, planar structures. For example, for a 1-D nanostructure the diameter or thickness of a nanowire is from 1 nm to 1,000 nm in length. For example, for a 2-D nanostructure the thickness of the planar structure is from 1 nm to 1,000 nm in length.

The definition of "surface engineering" is that part or all of at least one or more surfaces of the nanostructure is rough, has defects, and/or of a certain chemistry.

In some embodiments of the invention, the surface of a nanostructure is rough in that distance from the highest point to the lowest point relative to the surface is from more than 0 to 5 nm.

In some embodiments of the invention, the surface of a nanostructure is "rough" when the ratio (hereafter the "r ratio") of the actual surface area of the surface compared to the surface area of the surface if the surface was smooth is more than 1. In some embodiments, the r ratio is 2 or more, 3 or more, 4 or more, 5 or more, 10 or more, 20 or more, or 50 or more. The object of having the "rough" surface is to sufficiently scatter phonons in order to reduce k at lower temperatures, such as at room temperature or between about 20° C. to about 30° C. The surface can be "rough" as a result from the manufacturing process caused by the randomness of the lateral oxidation and/or etching by a corrosive aqueous solution or slow HF etching and/or faceting during the synthesis of the nanostructure.

In some embodiments of the invention, the surface of a nanostructure is "rough" when the roughness factor of the surface is more than 1.0. The roughness factor is defined as the ratio of the real surface area the nanostructure over that of a nanostructure with an atomically smooth surface. In some embodiments of the invention, the roughness factor of a nanostructure is at least equal to or more than 1.1, 1.2, 1.3, 1.4, 1.5, 1.6, 1.7, 1.8, 1.9, or 2.0. In other embodiments, the roughness factor of a nanostructure is at least equal to or more than 2.5, 3.0, 5.0, 7.0, or 10.0. In some embodiments, the roughness factor of a nanostructure is at least equal to or more than the roughness factor of one of the nanowires described in Example 1 and 2.

The nanostructure and the dopant materials can be selected from Groups II, III, IV, V, VI, or the like, and can include quaternaries and tertiaries, as well as oxides. In some embodiments, the semiconductor comprises one or more doped type II-VI semiconductor, type III-V semiconductor, type-II-IV semiconductor, and the like. In some embodiments, the semiconductor comprises one or more doped type II-VI semiconductor, type III-V semiconductor, type-II-IV semiconductor, and the like, and can optionally include quaternaries and tertiaries, as well as oxides. In some embodiments, the nanostructure comprises the elements Si, Ge, GaAs, CdSe, GaN, AlN, $Bi_2Te_3$, ZnO, and the like, or a combination thereof, and optionally doped with a valence-five element (for n-type doping) or a valence-three element (for p-type doping). In some embodiments, the nanostructure comprises the elements Si, Ge, or a combination thereof, and optionally doped with a valence-five element (for n-type doping) or a valence-three element (for p-type doping). Suitable dopants include B, Ph, As, In, Al, and the like. Suitable valence-five elements include P, As, Sb, or the like. Suitable valence-three elements include B, Al, Ga, or the like. In some embodiments, the dopant can replace between more than 0% to 100% of Si or Ge, or Si—Ge alloy, of the nanostructure. The nanostructure can be crystalline.

In some embodiments of the invention, each nanostructure is uniform in its composition, for example, any dopant is essentially uniformly distributed throughout the nanostructure, and/or the nanostructure does not comprise a p-type dopant in one end and an n-type dopant in the other end.

In some embodiments of the invention, the nanostructure comprises a 1-D nanostructure, such as a nanowire, comprising an elongated shape with a first end and a second end, and a rough surface, wherein the 1-D nanostructure comprises the elements Si, Ge, or a combination thereof, and optionally doped with a valence-five element or a valence-three element.

In some embodiments, the 1-D nanostructure has a substantially uniform diameter. In certain embodiments, the substantially uniform diameter is less than about 200 nm. In certain embodiments, the plurality of nanostructures is of a population of 1-D nanostructures having substantially monodisperse distribution of diameters and/or lengths. The term "diameter" refers to the effective diameter, as defined by the average of the major and minor axis of the cross-section of the structure.

In some embodiments, the 1-D nanostructure has a diameter of less than approximately 200 nm at its maximum point, and the diameter along the longitudinal axis preferably varies by less than approximately 10% over the section exhibiting the maximum change in diameter. Additionally, the 1-D nanostructures can have various cross-sectional shapes, including, but not limited, to circular, square, rectangular and hexagonal. For example, ZnO 1-D nanostructures have a hexagonal cross-section, $SnO_2$ 1-D nanostructures have a rectangular cross-section, PbSe 1-D nanostructures have a square cross-section, and Si or Ge 1-D nanostructures have a circular cross-section.

The diameter of the 1-D nanostructure is typically less than approximately 200 nm at the maximum point of diameter and preferably in the range from approximately 5 nm to approximately 50 nm. In addition, the variation in diameter across an ensemble of wires synthesized in the same process is relatively sharp, such that the distribution of diameters is typically less than about 50%, less than about 20%, or less than about 10%. Where the cross-section of the nanowire is not circular, the term "diameter" in this context refers to the average of the lengths of the major and minor axis of the cross-section of the 1-D nanostructure, with the plane being normal to the longitudinal axis of the 1-D nanostructure.

In some embodiments, the 1-D nanostructure typically exhibits a high uniformity in diameter from end to end. In certain embodiments, over a section of the 1-D nanostructure the maximum change in diameter would not exceed about 10%, about 5%, or about 1%. The change in diameter may be considered to be given by $(d_{max}-d_{min})/d_{min}$. It should be recognized by one of ordinary skill in the art that the ends of the 1-D nanostructure will contain a sharp change in diameter, possibly even exhibiting an infinite slope, wherein the measure described above is considered to be at a location away from the ends of the 1-D nanostructure. The measurement preferably being made at a location separated from an end by at least 5%, or at least 10%, of the total length of the 1-D nanostructure. In certain embodiments, the change in diameter is evaluated over a length of the 1-D nanostructure that ranges from about 1%, up to about 25%, up to about 75%, or up to about 90% of the total length of the 1-D nanostructure.

The 1-D nanostructure, such as a nanowire, can comprise a cylindrical shape with a rough surface along the shaft of the cylindrical shape. The diameter of the cylindrical shape can be about 5 nm or more, about 10 nm or more, about 20 nm or more, about 50 nm or more, or about 75 nm or more. The diameter of the cylindrical shape can be no more than about 100 nm, no more than about 200 nm, or no more than about 300 nm. In a plurality of 1-D nanostructures, there can be a plurality of the diameters of the 1-D nanostructures varying from about 5 nm or more to no more than about 300 nm. In some embodiments of the invention, in the plurality of 1-D nanostructures, there can be a plurality of the diameters of the 1-D nanostructures varying from about 10 nm or more, or about 20 nm or more, to no more than about 300 nm.

In some embodiments, the nanostructures of the invention have a k of about 2.0 W·m$^{-1}$·K$^{-1}$ or less, and/or a ZT of about 0.1 or more; at about room temperature or 25° C. In certain embodiments, the nanostructures of the invention have a k of about 1.0 W·m$^{-1}$·K$^{-1}$ or less, and/or a ZT of about 0.8 or more; at about room temperature or 25° C. In other embodiments, the nanostructures of the invention have a k of about 0.5 W·m$^{-1}$·K$^{-1}$ or less, and/or a ZT of about 3 or more; at about room temperature or 25° C.

The invention provides for the synthesis of large-area arrays of nanostructures that have a k≤about 1.0 W·m$^{-1}$·K$^{-1}$ and exhibit a ZT≥about 0.8. By incorporating phonon-scattering interfaces at various length scales, it is possible to impede thermal transport and improve ZT. In some embodiments, the k is reduced 100-fold in nanostructures of the present invention as compared to bulk at room temperature. Roughness at the nanostructure surfaces efficiently scatters phonons and reduces k even further at lower temperatures.

In one embodiment, the nanostructure is a Si nanowire. The invention provides for the synthesis of large-area arrays of rough Si nanowires that have a k of 1.0 W·m$^{-1}$·K$^{-1}$ and exhibit a large ZT=0.8. By incorporating phonon-scattering interfaces at various length scales, it is possible to impede thermal transport and improve ZT. In this case, the k of Si is reduced 100-fold in nanowires as compared to bulk at room temperature. Roughness at the nanowire surfaces efficiently scatters phonons and reduces k even further at lower temperatures. Although bulk Si is a poor thermoelectric material, by significantly reducing k without affecting other parameters, Si nanowire arrays show promise as high-performance and inexpensive thermoelectric materials for everyday applications.

In some embodiments of the invention, a plurality of the nanostructures are grouped together, such as in an array. In some arrays, all of the nanostructures are arranged parallel to each other.

Synthesis of the Nanostructure

The 1-D nanostructures and a plurality of 1-D nanostructures can be synthesized in any suitable method. Such methods include the methods described in Example 1 and 2 described herein, Peng et al., Synthesis of large-area silicon nanowire arrays via self-assembling nanochemistry, *Adv. Mater.*, 14(16): 1164-1167 (2002), and Peng et al., Aligned single-crystalline Si nanowire arrays for photovoltaic applications, small, 1(11): 1062-1067 (2005), which are hereby incorporated by reference in their entireties.

A plurality of nanowire, such as in an array, can be synthesized by an aqueous electroless etching (EE) method (Peng, K. Q., Yan, Y. J., Gao, S. P. & Zhu, J. Synthesis of large-area silicon nanowire arrays via self-assembling nanochemistry. *Adv. Mater.* 14, 1164-1167 (2002); Peng, K., Yan, Y., Gao, S. & Zhu, J. Dendrite-assisted growth of silicon nanowires in electroless metal deposition. *Adv. Funct. Mater.* 13, 127-132 (2003); Peng, K. et al. Uniform, axial-orientation alignment of one-dimensional single-crystal silicon nanostructure arrays. *Angew. Chem. Int. Edit.* 44, 2737 (2005), which are hereby incorporated by reference in their entireties). A wafer of a Si, Ge or combination thereof, is treated as follows: first is the galvanic displacement of the Si or Ge, or Si—Ge alloy, by Ag$^+$/Ag$^0$ reduction on the wafer surface. The reaction proceeds in an aqueous solution of AgNO$_3$ and HF. The Ag$^+$ reduces onto the Si, Ge or Si—Ge wafer surface by injecting holes into the Si, Ge or Si—Ge valence band and oxidizing the surrounding lattice, which is subsequently etched by HF. The initial reduction of Ag$^+$ forms Ag nanoparticles on the wafer surface, thus delimiting the spatial extent of the oxidation and etching process. Further reduction of Ag$^+$ occurs on the nanoparticles, not the Si, Ge or Si—Ge wafer, which becomes the active cathode by electron transfer from the underlying wafer. The 2-D nanostructures and a plurality of 2-D nanostructures of the present invention can be synthesized in any suitable method. Such methods include using Langmuir-Blodgett (LB) process, for example, described in "Langmuir-Blodgett silver nanowire monolayers for molecular sensing with high sensitivity and specificity", A. Tao, F. Kim, C. Hess, J. Goldberger, R. He, Y. Sun, Y. Xia, P. Yang, *Nano. Lett.* 3, 1229, 2003 (which is hereby incorporated in its entirety by reference). For example, the LB process can readily produce a monolayer or multi-layer of monodispersed nanocrystals. Such monolayers and multilayers can then be fused together to generate rough 2-D nanostructures.

Another suitable process of synthesizing 2-D nanostructures of the present invention comprises: (a) providing a physical or chemical vapor deposition (such as, atomic layer deposition or molecular beam epitaxy) to make a thin film with smooth surface, (b) dispersing one or more nanocrystals on the surface of the thin film, and (c) fusing the one or more nanocrystals to the thin films.

Devices Comprising the Nanostructure

The present invention provides for a device comprising a nanostructure, including the nanowires described in Peng, et al., Synthesis of large-area silicon nanowire arrays via self-assembling nanochemistry. *Adv. Mater.* 14, 1164-1167 (2002); Peng, et al., Dendrite-assisted growth of silicon nanowires in electroless metal deposition. *Adv. Funct. Mater.* 13, 127-132 (2003); and Peng, et al. Uniform, axial-orientation alignment of one-dimensional single-crystal silicon nanostructure arrays. *Angew. Chem. Int. Edit.* 44, 2737 (2005), contacting a first electrode and a second electrode. When the device is in operation, the first electrode and the second electrode are in electrical communication.

In some embodiments of the invention, the device comprises one or more 1-D nano structures, such as nanowires, of the present invention, wherein the first end contacts a first electrode and the second end contacts a second electrode.

In some embodiments of the invention, the method of creating an electric current comprises: providing a device of the present invention, and setting up a temperature gradient between the first and second electrodes, such that an electric current is created that flows from the first electrode to the 1-D nanostructure, such as a nanowire, and through the 1-D nanostructure to the second electrode.

In some embodiments of the invention, the device comprises: a first electrode; a second electrode; a third electrode; a first plurality of 1-D nanostructures, such as nanowires, each comprising an elongated shape with a first end and a second end, and a rough surface, wherein the 1-D nanostructures comprise Si, Ge, or a combination thereof, doped with a valence-three element (such that the 1-D nanostructures comprise a p-type semiconductor); and, a second plurality of 1-D nanostructures, such as nanowires, each comprising an elongated shape with a first end and a second end, and a rough surface, wherein the 1-D nanostructures comprise Si, Ge, or a combination thereof, doped with a valence-five element (such that the 1-D nanostructures comprise a n-type semiconductor); wherein the first end of the first plurality of 1-D nanostructures contacts the first electrode, the second end of the first plurality of 1-D nanostructures contacts the third electrode, the first end of the second plurality of 1-D nanostructures contacts the first electrode, the second end of the second plurality of 1-D nanostructures contacts the second electrode; such that when the first electrode has a higher temperature than the second and third electrodes an electric current is created that flows from the second electrode to the second plurality of 1-D nanostructures, through the second plurality of 1-D nanostructures to the first electrode, through first electrode to the first plurality of 1-D nanostructures, through the first plurality of 1-D nanostructures to the third electrode.

In some embodiments of the invention, the method of creating an electric current comprises: providing the device of the present invention having a first plurality of 1-D nanostructures, such as nanowires, and a second plurality of 1-D nanostructures, such as nanowires, and increasing the temperature of the first electrode; such that an electric current is created that flows from the second electrode to the second plurality of 1-D nanostructures, through the second plurality of 1-D nanostructures to the first electrode, through first electrode to the first plurality of 1-D nanostructures, through the first plurality of 1-D nanostructures to the third electrode.

In some embodiments of the invention, the method of decreasing the temperature of a locality comprises: providing a device of the present invention, and applying an electric current through the device; such that the temperature of the first electrodes is decreased, wherein the first electrode is at or near the locality, and the temperature of the second and third electrodes is increased.

In some embodiments, the device is such that the first electrode comprises a first opaque material and the second electrode comprises a second opaque material, wherein the first and second opaque materials are the same or different material. In some embodiments, the electrodes are not transparent, such as, an electrode comprising essentially of In-doped $SnO_2$ or Al-doped ZnO. In some embodiments, during the operation of the device, no or essentially no light or photons contact the nanostructure, such as nanowires, of the device, or there is no requirement for light or photons to contact the nanostructure, such as nanowires, of the device in order for the device to operate in its intended manner.

In some embodiments, the device is such that the first electrode and the second electrode are in electrical communication. Specifically, when the device is in operation, the first electrode and the second electrode are in electrical communication.

In some embodiments, the device is such that when there is a difference in temperature between the first electrode and the second electrode such that an electric current is created through the nanostructure.

In some embodiments of the invention, the device comprises a plurality of nanostructures, wherein the first end of each nanostructure contacts a first electrode and the second end of each nanostructure contacts a second electrode. When the temperature of the first electrode is increased relative to the temperature of the second electrode, or the temperature of the second electrode is decreased relative to the temperature of the first electrode, an electric current is created in which there is an electric current flowing from the first electrode to the nanostructure, and through the nanostructure to the second electrode. In some embodiments of the invention, the method of using the device described above further comprises maintaining a temperature difference (or temperature gradient) between the first and second electrodes, such the electrode with the higher temperature continues to have a higher temperature. When the device is in operation, the first electrode and the second electrode are in electrical communication.

In some embodiments of the invention, when the nanostructure is a nanowire, the device comprises a plurality of nanowires (30), wherein the first end of each nanowire (31) contacts a first electrode (10) and the second end of each nanowire (32) contacts a second electrode (20). When the temperature of the first electrode (10) is increased relative to the temperature of the second electrode (20), or the temperature of the second electrode (20) is decreased relative to the temperature of the first electrode (10), an electric current is created in which there is an electric current (60) flowing from the first electrode (10) to the nanowire (30), and through the nanowire (30) to the second electrode (20). (See FIG. 6.) When the device is in operation, the first electrode (10) and the second electrode (20) are in electrical communication.

Figure 6:
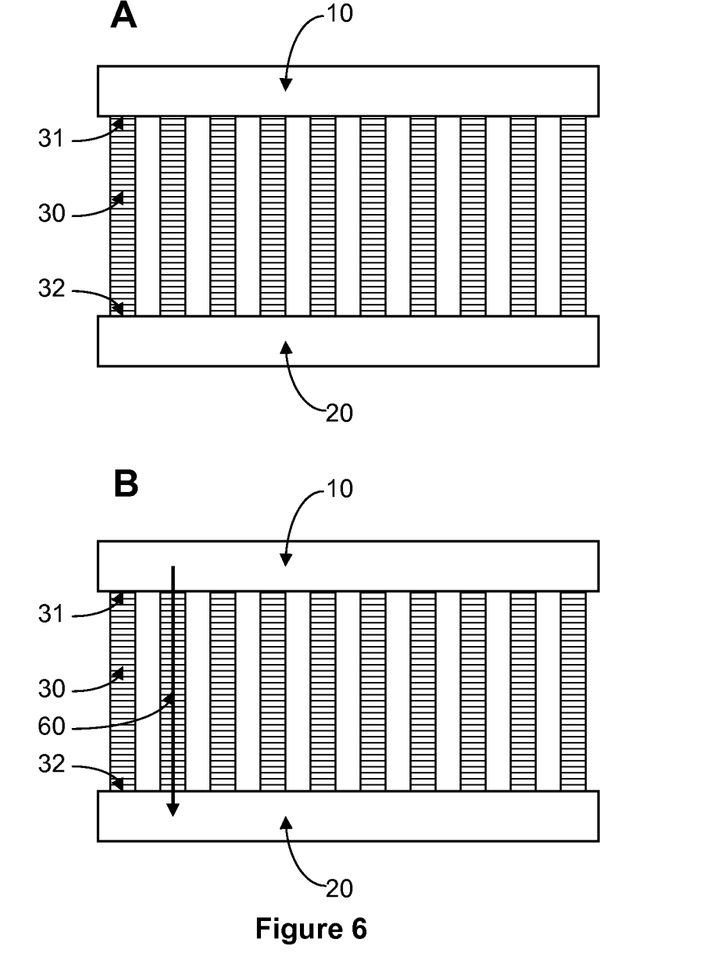
FIG. 6 shows a device comprising the nanowire useful for creating an electric current. The first plurality of nanowires are shown by the hatched rectangles. The second plurality of nanowires are shown by the dot-filled rectangles. Panel A shows the parts of the device. Panel B shows the electric current created by the use of the device.

In some embodiments of the invention, the method of using the device depicted in FIG. 6 further comprises maintaining a temperature difference (or temperature gradient) between the first and second electrodes, such the electrode with the higher temperature continues to have a higher temperature.

In some embodiments of the invention, when the nanostructure is a nanowire, the device comprises a first electrode (10); a second electrode (90); a third electrode (100); a first plurality of nanowires (40) each comprising an elongated shape with a first end (41) and a second end (42), and a rough surface, wherein each nanowire comprises Si, Ge, or a combination thereof, doped with a valence-five element; and, a second plurality of nanowires (50) each comprising an elongated shape with a first end (51) and a second end (52), and a rough surface, wherein each nanowire comprises Si, Ge, or a combination thereof, doped with a valence-three element; wherein the first end (41) of the first plurality of nanowires (40) contacts the first electrode (10), the second end (42) of the first plurality of nanowires (40) contacts the third electrode (100), the first end (51) of the second plurality of nanowires (50) contacts the first electrode (10), the second end (52) of the second plurality of nanowires (50) contacts the second electrode (90). When the temperature of the first electrode (10) is increased relative to the temperature of the second electrode (90) and third electrode (100), or the temperature of the second electrode (90) and third electrode (100) is decreased relative to the temperature of the first electrode (10), an electric current is created in which the electric current (70) flows from the second electrode (90) through the second plurality of nanowires (50) to the first electrode (10), the electric current flows (80) from the location where the first end (51) of the second plurality of nanowires (50) contacts the first electrode (10) to the location where the first end (41) of the first plurality of nanowires (40) contacts the first electrode (10), and the electric current flows (85) from the first electrode (10) through the first plurality of nanowires (40) to the third electrode (100). (See FIG. 7.) When the device is in operation, the second electrode (90) and the third electrode (100) are in electrical communication.

Figure 7:
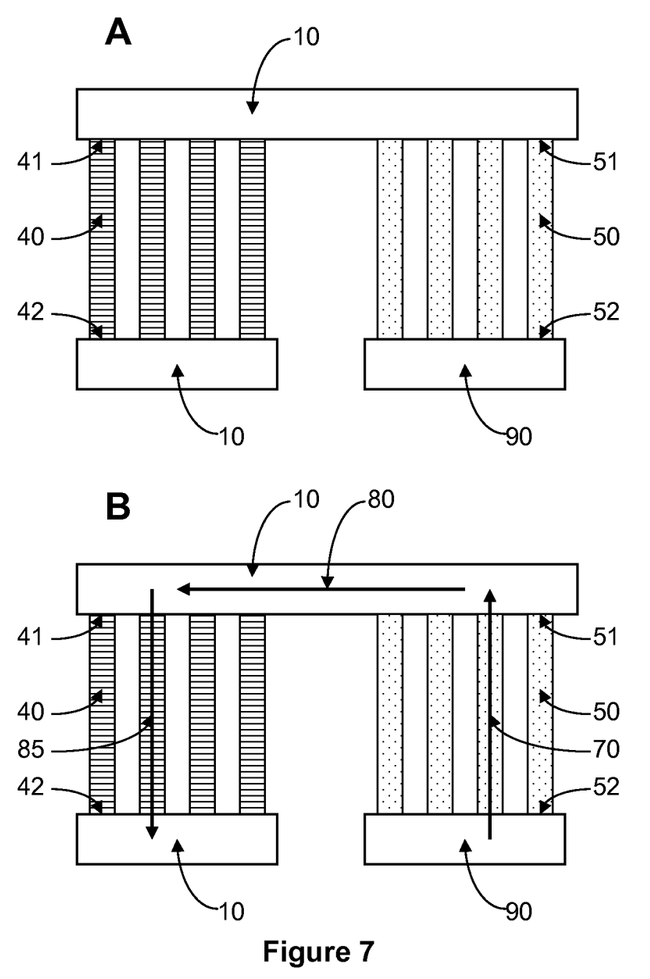
FIG. 7 shows a device comprising two pluralities of the nanowire useful for creating an electric current. Panel A shows the parts of the device. Panel B shows the electric current created by the use of the device. The first plurality of nanowires (40) has p-type doping. The second plurality of nanowires (50) has n-type doping.

In some embodiments of the invention, the method of using the device depicted in FIG. 7 further comprises maintaining a temperature difference (or temperature gradient) between (a) the first electrode and (b) the second and third electrodes.

The electrodes can comprise any suitable material, such as, Pt, Au, Ti, or the like.

The difference in temperature between the first and second electrodes is 1 degree or more, 5 degrees or more, 10 degrees or more, 50 degrees or more, 100 degrees or more, or 200 degrees or more. Any temperature is suitable as long as the temperature of each electrode does not result in the melting of any component of the device, or the interference of the desired electric current.

The electric current can be passed through or captured or stored by a capacitor, or the electric current can be used to drive any electrically driven machine that uses a direct current, such as a motor.

Figure 8:
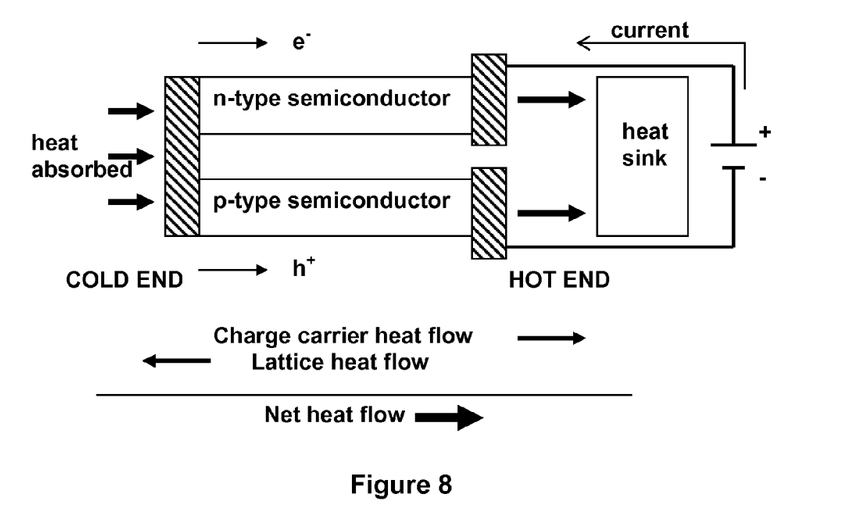
FIG. 8 shows a thermoelectric cooler incorporating a device of the present invention as shown in FIG. 7. The hatched boxes indicate the electrodes contacting the nanostructures.
Figure 9:
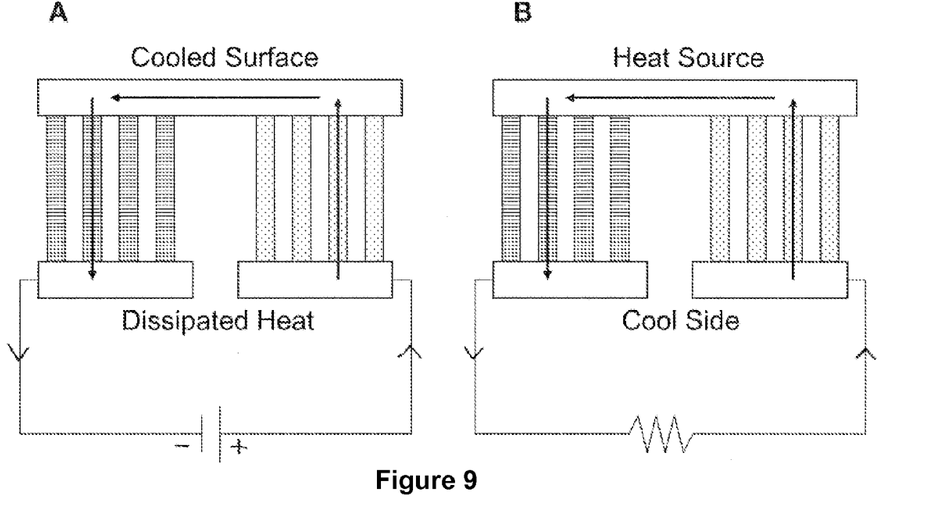
FIG. 9 shows a thermoelectric cooler (Panel A) and a thermoelectric power generator (Panel B) incorporating a device of the present invention as shown in FIG. 7. The arrows indicate the direction of flow of the electric current.

The device of the invention can be a thermoelectric power generator or thermoelectric cooler (see FIGS. 8 and 9). The device of the invention can be used for thermoelectric power generation or thermoelectric cooling, such as for computer chip cooling.

Any of the devices described above, including but not limited to the devices depicted in FIGS. 6-9, can be arranged in series and/or in array.

The invention having been described, the following examples are offered to illustrate the subject invention by way of illustration, not by way of limitation.

Example 1

Rough Silicon Nanowire

The most widely used commercial thermoelectric material is bulk $Bi_2Te_3$ and its alloys with Sb, Se, etc, which have ZT~1. While it is difficult to scale bulk $Bi_2Te_3$ to large-scale energy conversion, fabricating synthetic nanostructures for this purpose is even more difficult and expensive. Si, on the other hand, is the most abundant and widely used semiconductor with a large industrial infrastructure for low-cost and high-yield processing. Bulk Si, however, has a high k (~150 $W \cdot m^{-1} \cdot K^{-1}$ at room temperature) (Touloukian, Y. S., Powell, R. W., Ho, C. Y. & Klemens, P. G. *Thermal Conductivity: Metallic Elements and Alloys, Thermophysical Properties of Matter*, v. 1, IFI/Plenum, New York, 339 (1970)), making the ZT~0.009 at 300 K (Weber, L. & Gmelin, E. Transport properties of silicon. *Appl. Phys. A* 53, 136-140 (1991), which are hereby incorporated by reference in their entireties). The spectral distribution of phonons contributing to the k of Si at room temperature is quite broad. Because the rate of phonon-phonon Umklapp scattering scales as $\omega^2$, where $\omega$ is the phonon frequency, low frequency (or long-wavelength) acoustic phonons have long mean free paths and contribute significantly to k at high temperatures (Nolas, G. S. & Sharp, J., Goldsmid, H. J. *Thermoelectrics: Basic Principles and New Materials Development*, Springer-Verlag, Berlin, 2001; Asheghi, M., Leung, Y. K., Wong, S. S. & Goodson, K. E. Phonon-boundary scattering in thin silicon layers. *Appl. Phys. Lett.* 71, 1798-1800 (1997); Asheghi, M., Touzelbaev, Goodson, K. E., Leung, Y. K. & Wong, S. S. Temperature-dependent thermal conductivity of single-crystal silicon layers in SOI substrates. *J. Heat Transf* 120, 30-36 (1998); Ju, Y. S. & Goodson, K. E. Phonon scattering in silicon films with thickness of order 100 nm. *Appl. Phys. Lett.* 74, 3005-3007 (1999), which are hereby incorporated by reference in their entireties). Thus, by rational incorporation of phonon-scattering elements at several length scales, the k of Si is expected to decrease dramatically. Here, we show that by using roughened nanowires, one can reduce the thermal conductivity to ~1 $W \cdot m^{-1} \cdot K^{-1}$ without significantly modifying $S^2\sigma$, such that ZT~1 at room temperature. Further reduction of nanowire diameter is likely to increase ZT>1, offering the possibility of high-performance, low-cost and scalable Si-based thermoelectric devices.

Wafer-scale arrays of Si nanowires were synthesized by an aqueous electroless etching (EE) method (Peng, K. Q., Yan, Y. J., Gao, S. P. & Zhu, J. Synthesis of large-area silicon nanowire arrays via self-assembling nanochemistry. *Adv. Mater.* 14, 1164-1167 (2002); Peng, K., Yan, Y., Gao, S. & Zhu, J. Dendrite-assisted growth of silicon nanowires in electroless metal deposition. *Adv. Funct. Mater.* 13, 127-132 (2003); Peng, K. et al. Uniform, axial-orientation alignment of one-dimensional single-crystal silicon nanostructure arrays. *Angew. Chem. Int. Edit.* 44, 2737 (2005), which are hereby incorporated by reference in their entireties). The technique is based on the galvanic displacement of Si by $Ag^+/Ag^0$ reduction on the wafer surface. The reaction proceeds in an aqueous solution of $AgNO_3$ and HF. Briefly, $Ag^+$ reduces onto the Si wafer surface by injecting holes into the Si valence band and oxidizing the surrounding lattice, which is subsequently etched by HF. The initial reduction of $Ag^+$ forms Ag nanoparticles on the wafer surface, thus delimiting the spatial extent of the oxidation and etching process. Further reduction of $Ag^+$ occurs on the nanoparticles, not the Si wafer, which becomes the active cathode by electron transfer from the underlying wafer.

Figure 1:
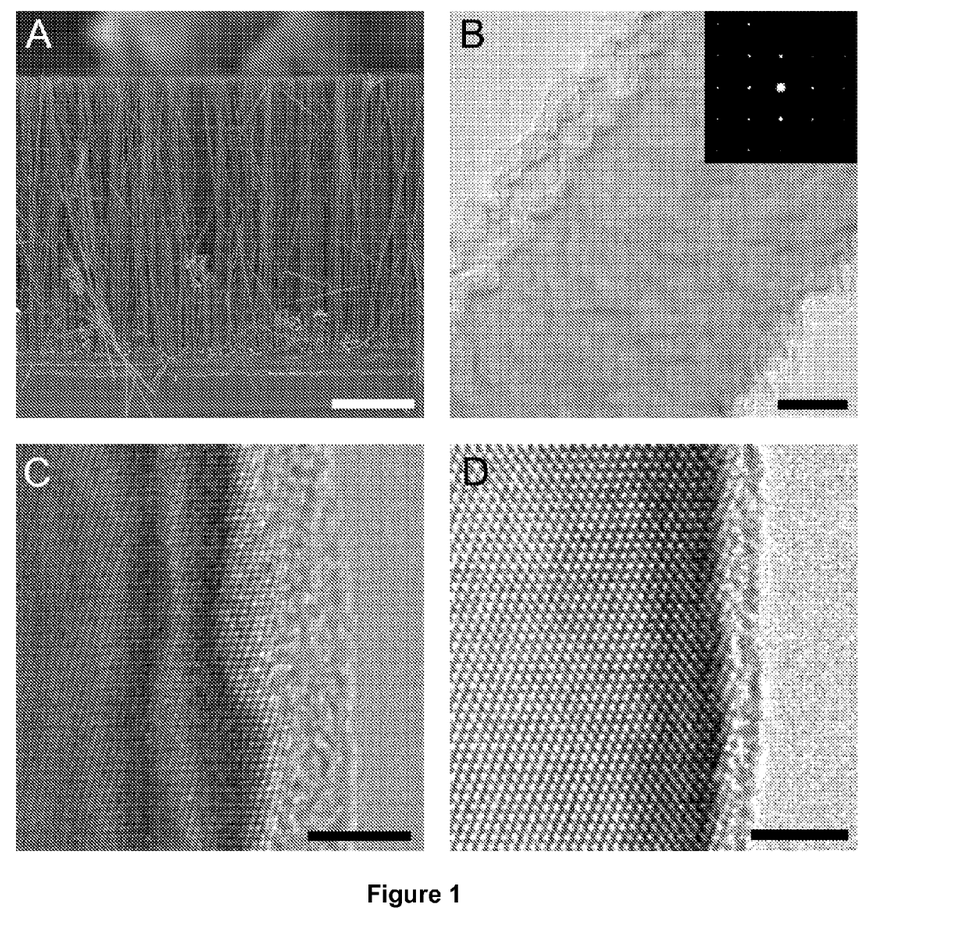

Nanowires synthesized by this approach were vertically aligned and consistent throughout batches up to the wafer scale. FIG. 1, Panel A shows a cross-sectional scanning electron microscope (SEM) image of one such array. Key parameters of the reaction were identified using p-type (100) oriented, nominally 10-20 $\Omega \cdot cm$ Si as the etch wafer. Both etching time and $AgNO_3$ concentration controlled nanowire length, roughly linearly, down to 5 μm at short immersion times (<10 minutes). At longer etching times, nanowire lengths were controllable up to 150 μm, while longer wires were too fragile to preserve the array. Wafers cut to (100), (110), and (111) orientations all yielded nanowire arrays etched normal to the wafer surface over most of the wafer area. Similar results were obtained for electroless etching of both n- and p-type wafers with resistivities varying from 0.01 to 10 $\Omega \cdot cm$. Since thermoelectric modules consist of complementary p- and n-type materials wired in series, the generality and scalability of this synthesis indicate it is a promising method for fabrication of Si-based devices.

After etching, the fill factor of the nanowires was approximately 30 percent over the entire wafer surface. The nanowires varied from 20 to 300 nm in diameter with an average diameter of approximately 100 nm, as measured from transmission electron microscope (TEM) micrographs (FIG. 1, Panel B). The nanowires were single crystalline, as evidenced by the selected area electron diffraction (SAED) pattern (top inset) and high-resolution TEM (HRTEM) image of the Si lattice of the nanowire in FIG. 1, Panel C. In contrast to the smooth surface of typical vapor-liquid-solid (VLS) grown, gold catalyzed Si nanowires (FIG. 1, Panel D) (Li, D. et al. Thermal conductivity of individual silicon nanowires. *Appl. Phys. Lett.* 83, 2934-2936 (2003); Hochbaum, A. I., Fan, R., He, R. & Yang, P. Controlled growth of Si nanowire arrays for device integration. *Nano Lett.* 5, 457-460 (2005)), which are hereby incorporated by reference in their entireties, those of the EE Si nanowires are much rougher. The mean roughness height of these nanowires varied wire to wire, but was typically 1 to 5 nm with a roughness period on the order of several nanometers. This roughness may be attributed to randomness of the lateral oxidation and etching in the corrosive aqueous solution or slow HF etching and faceting of the lattice during synthesis.

The key advantage of using Si nanowires for thermoelectric applications lies in the large difference in mean free path lengths between electrons and phonons at room temperature: 1-10 nm for electrons in highly doped samples (Ashcroft, N. W. & Mermin, N. D. *Solid State Physics*, Saunders College Publishing, Fort Worth, ch. 1, 2, 13 (1976); Sze, S. M. *Physics of Semiconductor Devices*, John Wiley & Sons, Inc., New York, ch. 1 (1981), which are hereby incorporated by reference in their entireties) and ~300 nm for phonons at room temperature (Ju, Y. S. & Goodson, K. E. Phonon scattering in silicon films with thickness of order 100 nm. *Appl. Phys. Lett.*

Figure 2:
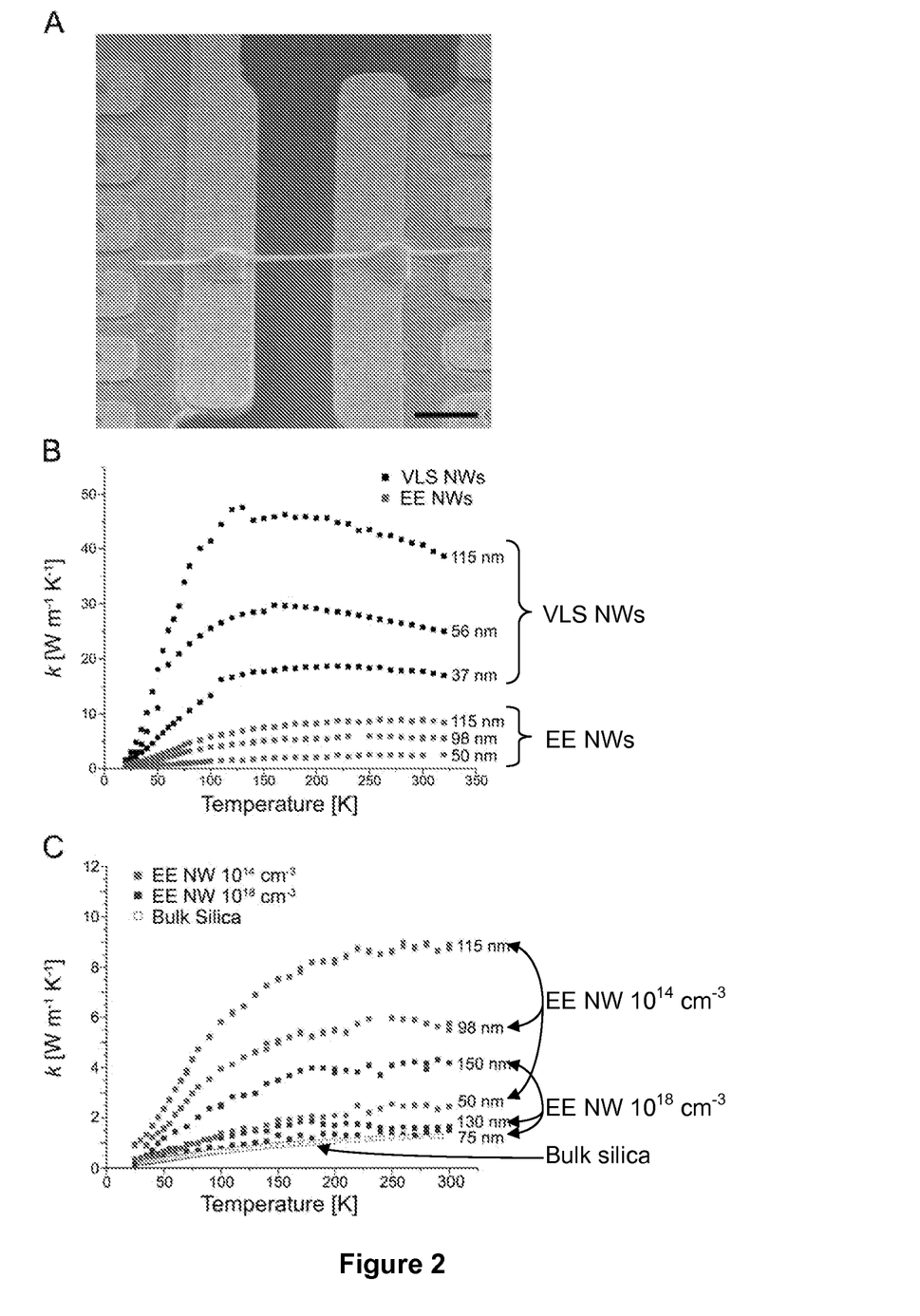

74, 3005-3007 (1999), which is hereby incorporated by reference in its entirety). The mean free path of electrons was calculated by $l_e = v_{th} \cdot \tau$, where $$v_{th} = \sqrt{\frac{3k_B T}{m^*}}$$

is the electron thermal velocity and $$\tau = \frac{\mu \cdot m^*}{q}$$

is the mean scattering time expressed in terms of the mobility ($\mu$), effective conduction electron mass ($m^* = 0.26 \cdot m_0$), and the elementary electron charge (q). For a highly doped n-type Si wafer the mobility was extracted from Hall measurements (see Example 2). $\mu = 265$ cm$^2 \cdot$V$^{-1} \cdot$s$^{-1}$ at room temperature, yielding an electron mean free path of 8.98 nm. More highly doped Si samples will have a shorter mean free path as the mobility decreases due to ionized impurity scattering. Consequently nanostructuring Si below 300 nm should reduce the thermal conductivity without significantly affecting $S^1 \sigma$, which is mainly controlled by electron transport. The thermal conductivity of these hierarchically structured Si nanowires was characterized using devices consisting of resistive coils supported on parallel, suspended SiN$_x$ membranes (Li, D. et al. Thermal conductivity of individual silicon nanowires. *Appl. Phys. Lett.* 83, 2934-2936 (2003); Shi, L. et al. Measuring thermal and thermoelectric properties of one-dimensional nanostructures using a microfabricated device. *J. Heat Transf.* 125, 881-888 (2003), which are hereby incorporated by reference in their entireties). To anchor the nanowire to the membranes and reduce contact resistance, a Pt—C composite was deposited on both ends using a focused ion beam (FIG. 2, Panel A). The membranes are thermally connected through a bridging nanowire, with negligible leakage from heat transfer by means other than conduction through the wire. The thermal conductivity was extracted from the thermal conductance using the dimension of the nanowire, as determined by SEM.

FIG. 2, Panel B shows the measured thermal conductivity of both VLS and EE Si nanowires. It was previously known that the k of VLS Si nanowires is strongly diameter dependent (14), which is attributed to boundary scattering of phonons. We found that EE Si nanowires exhibit a diameter dependence of k similar to that of VLS-grown wires. What is surprising is that the magnitude of k is five- to eight-fold lower for EE nanowires of comparable diameters. Since the phonon spectrum is broad and Planck-like, reduction of k can be achieved by introducing scattering at additional length scales beyond the nanowire diameter (Majumdar, A. Thermoelectricity in semiconductor nanostructures. *Science* 303, 777-778 (2004); Hsu, K. F. et al. Cubic AgPb$_m$SbTe$_{2+m}$: bulk thermoelectric materials with high figure of merit. *Science* 303, 818-821 (2004); Harman, T. C., Taylor, P. J., Walsh, M. P. & LaForge, B. E. Quantum dot superlattice thermoelectric materials and devices. *Science* 297, 2229-2232 (2002); Venkatasubramanian, R., Siivola, E., Colpitts, T. & O'Quinn, B. Thin-film thermoelectric devices with high room-temperature figures of merit. *Nature* 413, 597-602 (2001); Kim, W. et al. Thermal conductivity reduction and thermoelectric figure of merit increase by embedding nanoparticles in crystalline semiconductors. *Phys. Rev. Lett.* 96, 045901-1-045901-4 (2006), which are hereby incorporated by reference in their entireties). In the case of the EE nanowires, the roughness at the nanowire surface behaves like secondary phase particles in a crystal by scattering phonons of medium- to long-wavelengths. The roughness may contribute to higher rates of diffuse reflection or backscattering of phonons at the interfaces. These processes have been predicted to affect k of Si nanowires, but not to the extent observed here (Zou, J. & Balandin, A. Phonon heat conduction in a semiconductor Nanowire. *J. App. Phys.* 89, 2932-2938 (2001); Saha, S., Shi, L. & Prasher, R. Monte Carlo simulation of phonon backscattering in a Nanowire. *Proc. of Int. Mech. Eng. Congress and Exp.* IMECE2006-15668: 1-5 (2006)). The peak k is shifted to a much higher temperature than that of VLS nanowires, and both are significantly higher than that of bulk Si, which peaks around 25 K (Touloukian, Y. S., Powell, R. W., Ho, C. Y. & Klemens, P. G. *Thermal Conductivity Metallic Elements and Alloys, Thermophysical Properties of Matter*, v. 1, IFI/Plenum, New York, 339 (1970), which are hereby incorporated by reference in their entireties). This shift suggests that the phonon mean free path is limited by boundary scattering as opposed to intrinsic Umklapp scattering.

To further decrease k by introducing a third length scale (point defects), nanowires were etched from highly doped (As) n-type (100) wafers with a carrier concentration of $1 \times 10^{18}$ cm$^{-3}$. Indeed these nanowires show a four-fold decrease in k from low-doped EE Silicon nanowires ($1 \times 10^{14}$ cm$^{-3}$) of similar diameters, as seen in FIG. 2, Panel C. Studies of doped and isotopically purified bulk Si have observed a reduction of k as a result of impurity scattering (Weber, L. & Gmelin, E. Transport properties of silicon. *Appl. Phys. A* 53, 136-140 (1991); Brinson, M. E. & Dunstan, W. Thermal conductivity and thermoelectric power of heavily doped n-type silicon. *J. Phys. C* 3, 483-491 (1970); Ruf, T. et al. Thermal conductivity of isotopically enriched silicon. *Solid State Commun.* 115, 243-247 (2000), which are hereby incorporated by reference in their entireties). Due to the atomic nature of such defects, they are expected to predominantly scatter short-wavelength phonons. In the case of these highly doped nanowires, the k of wires approximately 100 nm in diameter has been reduced to 1.5 W·m$^{-1}$·K$^{-1}$ at room temperature. For comparison, the temperature dependent k of amorphous bulk SiO$_2$ (data points used from http://users.mrl.uiuc.edu/cahill/tcdata/tcdata.html, agree with measurement in Cahill, D. G. & Pohl, R. O. Thermal conductivity of amorphous solids above the plateau. *Phys. Rev. B* 35, 4067-4073 (1987), which is hereby incorporated by reference in its entirety) is also plotted in FIG. 2, Panel B, suggesting that the total k of highly doped single-crystal EE Si nanowires is comparable to that of insulating glass where the phonon mean free paths are on the order of interatomic spacings. Furthermore, the peak ZT for semiconductors is predicted to occur at a dopant concentration of $1 \times 10^{19}$ cm$^{-3}$, so optimally doped wires would likely have an even lower k (Rowe, D. M. ed. *CRC Handbook of Thermoelectrics*, CRC Press, Boca Raton, ch. 5 (1995), which is hereby incorporated by reference in its entirety).

Figure 3:
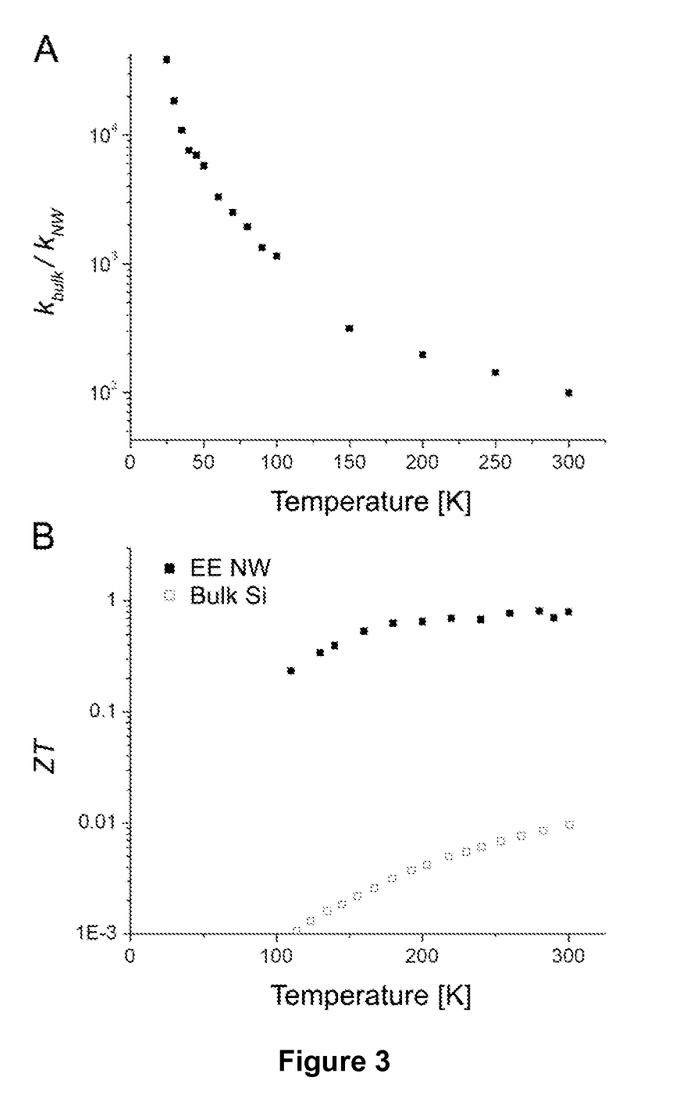

Another consequence of strong scattering of phonons at the EE Silicon nanowire surface is that as the temperature decreases, the disparity between k of the nanowire and bulk grows. At low temperatures, the long wavelength phonon modes, which contribute strongly to thermal transport in bulk, are efficiently scattered in the roughened nanowires. FIG. 3, Panel A charts the ratio of $k_{bulk}:k_{nw}$ for a 75 nm highly doped EE Silicon nanowire as a function of temperature. While the $k_{nw}$ is two orders of magnitude lower than $k_{bulk}$ at room temperature, this ratio reaches more than five orders of magnitude at low temperature. Such a large disparity of k bodes well for significant ZT enhancement.

To calculate the nanowire ZT, resistivity and Seebeck measurements were carried out on the exact wafers from which the nanowires were etched. The EE reaction proceeds near room temperature, so no dopant or impurity diffusion in or out of the wire is expected, i.e. the nanowire should retain the same crystalline structure and defects of the wafer. Additionally, because the nanowires are many times larger than the mean free path of electrons in Si, no significant electron scattering should occur, and the resistivity and Seebeck coefficient should be consistent with that of bulk (see Example 2 for measurements). The ZT for the 75 nm EE Si nanowire is highest near room temperature at 0.8 (FIG. 3, Panel B). Although the Seebeck coefficient of the highly doped Si initially increases slightly with decreasing temperature, the rise is not sufficient to offset the rapid increase of resistivity. Consequently, the ZT decreases monotonically with temperature. As compared to optimally doped bulk Si ($\sim 1 \times 10^{19}$ cm$^{-3}$), the ZT of the EE nanowire is close to 100 times greater throughout the temperature range measured.

In conclusion, we have shown that it is possible to achieve ZT=0.8 at room temperature in rough Si nanowires of 75 nm diameter that were processed by a wafer scale manufacturing technique. Furthermore, with optimal doping, diameter reduction, and roughness control, the ZT is likely to rise even higher. This ZT enhancement can be attributed to the efficient scattering, throughout the phonon spectrum, by the introduction of nanostructures at different length scales (diameter, roughness, and point defects). By achieving broadband impedance of phonon transport, we have demonstrated that the EE Si nanowire system is capable of approaching the limits of minimum lattice thermal conductivity in crystals. Furthermore, modules with the efficiencies reported here, and manufactured from such an inexpensive and ubiquitous material as Si, would find wide-ranging applications in waste heat salvaging, power generation, and solid-state refrigeration. Moreover, the phonon scattering techniques developed in this study could significantly augment ZT even further in other materials (there is no theoretical limit) and produce highly efficient solid-state devices with the potential to replace mechanical power generation and refrigeration systems.

Example 2

Nanowire Synthesis

The standard nanowire synthesis was conducted on B-doped p-type (100) Si wafers. Wafer chips were sonicated in acetone and 2-propanol, and then put in a Teflon-lined autoclave in aqueous solution of 0.02 M AgNO$_3$ and 5 M hydrofluoric acid (HF). The autoclave was sealed and placed in an oven at 50° C. for one hour. For 150 µm-long nanowires, wafer chips were prepared in the same fashion, and placed in the autoclave with 0.04 M AgNO$_3$ and 5 M HF for four hours. Nanowires were also etched from entire Si wafers. Wafers were cleaned and placed in a Teflon dish with an identical etching solution and the synthesis ran at room temperature. The wafers etched in the open dish at room temperature produced wires similar to those etched in the autoclave but <50 µm in length. The same reaction conditions were used on wafers of all orientations, dopant type and concentration. Small regions on all samples had nanowires etched at an angle to normal.

Nanowire Characterization.

Cross-sectional samples were prepared by cleaving the EE Si nanowire substrate and viewing normal to the cleaved surface. SEM images were obtained using a JEOL JSM-6340F field emission SEM and a FEI Strata 235 Dual Beam FIB. TEM and HRTEM images were collected with a Phillips CM200/FEG (field-emission gun) microscope at 200 kV.

Thermal Bonding of Nanowires.

EE Si nanowires were bonded to both suspended SiN$_x$ using a FEI Strata 235 Dual Beam FIB. A focused electron (5 kV, spot size 3) or ion (Ga ions, 30 kV, 10 pA aperture) beam was used to deposit Pt selectively on either end of the bridging nanowire. The incident beams cause secondary electron emission from the underlying material's surface, locally decomposing a metal-organic Pt precursor. Care was taken not to expose the sample to electron or ion irradiation immediately following deposition, but some deposition always occurs within a one to two micron radius of the exposed region.

Figure 4:
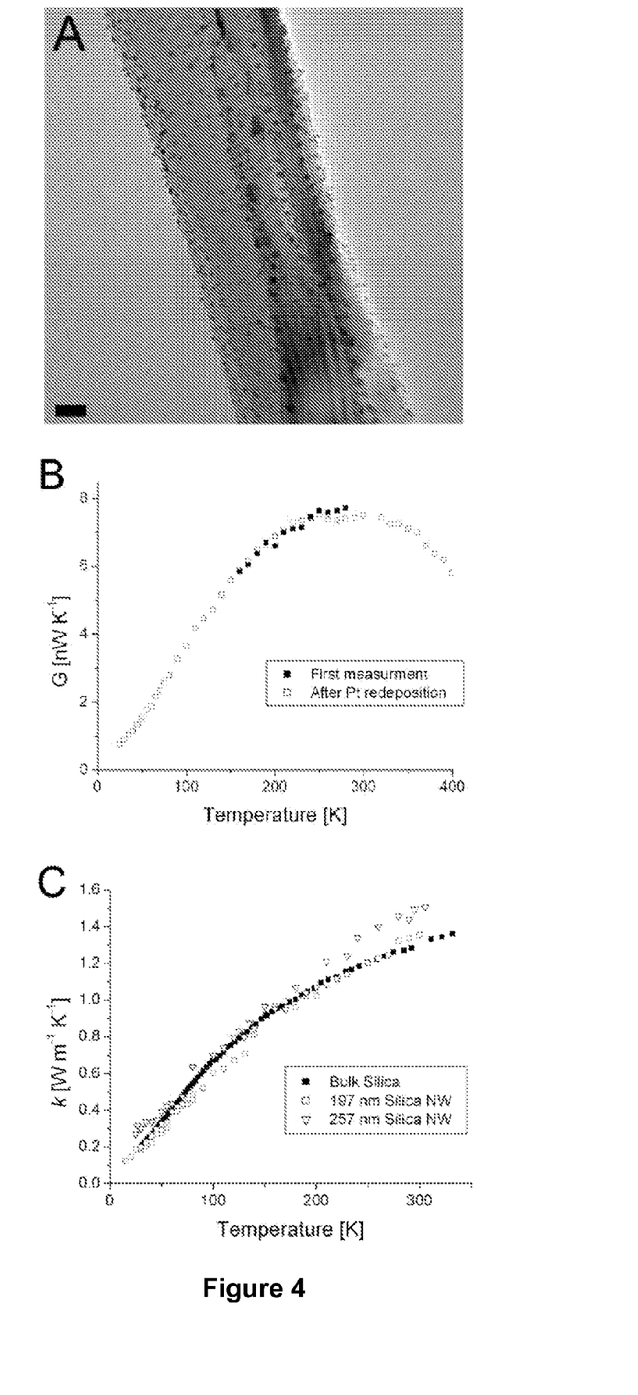

This deposition is in the form of a Pt-carbon composite, is due to low intensity secondary electron emission away from the irradiated region, and is unavoidable. FIG. 4, Panel A shows a TEM of such deposition on two bridging Si nanowires near the midpoint between both membranes. The Pt is deposited in the form of nanoparticles embedded in an amorphous carbon matrix—a product of the metal-organic precursor decomposition. The nanoparticles do not form a continuous film, and the contribution of the Pt-carbon composite to thermal conductance is negligible, as demonstrated by repeated bonding and excess deposition on the same nanowire after a first measurement (FIG. 4, Panel B). The temperature-dependent thermal conductivity from both measurements is the same.

Calibration of Nanowire Measurements.

To demonstrate the accuracy of these thermal transport experiments, the k of SiO$_2$ nanowires was measured with this apparatus. SiO$_2$ nanowires were prepared by dry oxidation of VLS-grown Si nanowires at 1000° C. for 24 hours. TEM analysis of the oxidized wires showed no crystalline material remaining and energy dispersive X-ray spectroscopy confirmed the presence of abundant O within the nanowires. The k of these wires (FIG. 4, Panel C) is very close to that of bulk amorphous SiO$_2$, which was expected since the mean free path of phonons approaches that of the interatomic spacing in an amorphous solid. Consequently, no increased boundary scattering was observed as compared to bulk.

Resistivity Measurement.

Figure 5:
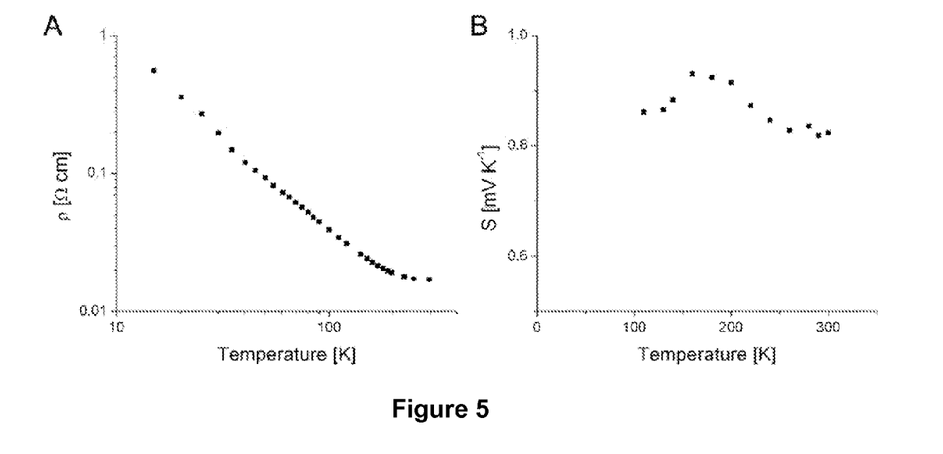

A chip (1×1 cm) of the wafer from which nanowires were etched was sonicated in acetone and 2-propanol and stripped of its native oxide in a 30 sec. buffered HF bath. After rinsing in de-ionized water for 15 sec., the wafer was immediately transferred to a high-vacuum thermal evaporation chamber. 20 nm Ti and 20 nm Au were deposited onto only the corners of the Si chip by masking the rest with aluminum foil. Afterwards, an additional ~300 nm of Au was deposited by sputtering. The chip was then rapid thermal annealed for 3 min. at 450° C. Indium was used to wire bond external contacts onto the chip, and the temperature-dependent resistivity was experimentally determined by a Hall measurement (FIG. 5, Panel A). This resistivity corresponds to a doping concentration of $1.7 \times 10^{18}$ cm$^{-3}$. For ZT determination, temperature points between experimentally measured values were extrapolated by linear interpolation.

Seebeck Measurement.

The Seebeck coefficient (S) of bulk silicon was measured in a home-built cryostat setup by fixing a chip (1×2 cm) between two thermoelectric (TE) devices separated by a 3 mm gap. Heating one TE device while cooling the other one generated a temperature gradient (ΔT) along the length sample. A Lakeshore Model 331 temperature controller and two T-type thermocouples (Copper-Constantan, Omega Model 5SRTC) affixed to each end of the chip were used to measure ΔT. A Keithley Model 2400 source meter controlled power of the TE devices, and ΔT across the sample was maintained at less than 2 K. To measure the thermoelectric voltage (ΔV) of the sample, a Keithley Model 2001 multimeter was connected to the two copper probes of the thermocouples. S of the Si sample was calculated by S=−ΔV/ΔT. S of Cu (~6 uV/K) is less than 1% of that of Si and is neglected in the calculation. The measured Seebeck coefficient (FIG. 5, Panel B) agrees well with literature data (Geballe, T. H. & Hull, G. W. Seebeck effect in silicon. *Phys. Rev.,* 98, 940 (1955); Brinson, M. E. & Dunstan, W. Thermal conductivity and thermoelectric power of heavily doped n-type silicon. *J. Phys. C* 3, 483-491 (1970); van Herwaarden, A. W. The Seebeck effect in silicon Ics. *Sensors and Actuators,* 6, 245-254 (1984), which are hereby incorporated by reference in their entireties).

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

We claim:

1. A thermoelectric device comprising one or more one-dimensional (1-D) or two-dimensional (2-D) nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature, and wherein each nanostructure contacts a first electrode and a second electrode.

2. The device of claim 1, wherein the first electrode comprises a first opaque material and the second electrode comprises a second opaque material, wherein the first and second opaque materials are the same or different material.

3. The device of claim 1, wherein the first electrode and the second electrode are in electrical communication.

4. The device of claim 1, wherein when there is a difference in temperature between the first electrode and the second electrode such that an electric current is created through the nanostructure.

5. A method of creating an electric current comprising:
(a) providing the device of claim 4, and
(b) increasing the temperature of the first electrode, such that an electric current is created that flows from the first electrode to the nanostructure, and through the nanostructure to the second electrode.

6. A device comprising one or more of a 1-D nanostructure in accordance with claim 1, wherein 1-D nanostructure comprises a first end and a second end, wherein the first end contacts a first electrode and the second end contacts a second electrode.

7. The device of claim 6, wherein the 1-D nanostructure is a nanowire.

8. The device of claim 7, wherein the first electrode comprises a first opaque material and the second electrode comprises a second opaque material, wherein the first and second opaque materials are the same or different material.

9. The device of claim 6, wherein the first electrode and the second electrode are in electrical communication.

10. The device of claim 6, wherein when there is a difference in temperature between the first electrode and the second electrode such that an electric current is created through the 1-D nanostructure.

11. A method of creating an electric current comprising:
(a) providing the device of claim 10, and
(b) increasing the temperature of the first electrode, such that an electric current is created that flows from the first electrode to the 1-D nanostructure, and through the 1-D nanostructure to the second electrode.

12. A thermoelectric device comprising:
(a) a first electrode;
(b) a second electrode;
(c) a third electrode;
(d) a first plurality of one-dimensional (1-D) or two-dimensional (2-D) nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature; and,
(e) a second plurality of 1-D or 2-D nanostructures comprising a rough surface, wherein each nanostructure comprises a semiconductor, and optionally doped;
wherein the first plurality of nanostructures contact the first electrode and the third electrode, the second plurality of nanostructures contact the first electrode and the second electrode, and the second electrode is in electrical communication with the third electrode; such that when the first electrode has a higher temperature than the second electrode an electric current is created that flows from the second electrode to the second plurality of nanostructures, through the second plurality of nanostructures to the first electrode, through first electrode to the first plurality of nanostructures, through the first plurality of nanostructures to the third electrode.

13. A thermoelectric power generator comprising the device of claim 12.

14. A thermoelectric cooler comprising the device of claim 12.

15. A method of creating an electric current comprising:
(a) providing the device of claim 12, and
(b) increasing the temperature of the first electrode; such that an electric current is created that flows from the second electrode to the second plurality of nanostructures, through the second plurality of nanostructures to the first electrode, through the first electrode to the first plurality of nanostructures, through the first plurality of nanostructures to the third electrode.

16. A method of decreasing the temperature at a locality comprising:
(a) providing the device of claim 12 wherein an electric power is in communication with the second and third electrodes and the first electrode is at or near the locality, and
(b) flowing an electric current from the second electrode to the second plurality of nanostructures, through the second plurality of nanostructures to the first electrode, through the first electrode to the first plurality of nanostructures, through the first plurality of nanostructures to the third electrode; such that the temperature at the locality is decreased.

17. A thermoelectric device comprising:
(a) a first electrode;
(b) a second electrode;
(c) a third electrode;
(d) a first plurality of 1-D nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature; and,
(e) a second plurality of 1-D nanostructures each comprising an elongated shape with a first end and a second end, and a rough surface, wherein each 1-D nanostructure comprises semiconductor, doped with a valence-five element;
wherein the first end of the first plurality of 1-D nanostructures contacts the first electrode, the second end of the first plurality of 1-D nanostructures contacts the third electrode, the first end of the second plurality of 1-D nanostructures contacts the first electrode, the second end of the second plurality of 1-D nanostructures contacts the second electrode, and the second electrode is in electrical communication with the third electrode; such that when the first electrode has a higher temperature than the second electrode an electric current is created that flows from the second electrode to the second plurality of 1-D nanostructures, through the second plurality of 1-D nanostructures to the first electrode, through first electrode to the first plurality of 1-D nanostructures, through the first plurality of 1-D nanostructures to the third electrode.

18. A thermoelectric power generator comprising the device of claim 17.

19. A thermoelectric cooler comprising the device of claim 17.

20. A method of creating an electric current comprising:
(a) providing the device of claim 17, and
(b) increasing the temperature of the first electrode; such that an electric current is created that flows from the second electrode to the second plurality of 1-D nanostructures, through the second plurality of 1-D nanostructures to the first electrode, through the first electrode to the first plurality of 1-D nanostructures, through the first plurality of 1-D nanostructures to the third electrode.

21. A method of decreasing the temperature at a locality comprising:
(a) providing the device of claim 17 wherein an electric power is in communication with the second and third electrodes and the first electrode is at or near the locality, and
(b) flowing an electric current from the second electrode to the second plurality of 1-D nanostructures, through the second plurality of 1-D nanostructures to the first electrode, through the first electrode to the first plurality of 1-D nanostructures, through the first plurality of 1-D nanostructures to the third electrode; such that the temperature at the locality is decreased.

22. An apparatus for thermal-electric conversion, the apparatus comprising:
a first electrode;
a second electrode; and
one or more nanostructures located between the first electrode and the second electrode, the one or more nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature;
wherein:
the each of the one or more nanostructures is in contact with the first electrode and the second electrode;
the each of the one or more nanostructures includes a surface associated with a mean surface roughness, ranging from 1 nm to 5 nm.

23. An apparatus for thermal-electric conversion, the apparatus comprising:
a first electrode;
a second electrode;
a third electrode;
one or more first nanostructures located between the first electrode and the second electrode, the one or more nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature;
one or more second nanostructures located between the second electrode and the third electrode, each of the one or more second nanostructures including one or more second semiconductor materials;
wherein:
the each of the one or more first nanostructures is in contact with the first electrode and the second electrode;
the each of the one or more second nanostructures is in contact with the second electrode and the third electrode;
the each of the one or more first nanostructures includes a first surface associated with a first mean surface roughness, ranging from 1 nm to 5 nm; and
the each of the one or more second nanostructures includes a second surface associated with a second mean surface roughness, ranging from 1 nm to 5 nm.

24. An apparatus for thermal-electric conversion, the apparatus comprising:
a first electrode;
a second electrode;
a third electrode;
one or more nanostructures located between the first electrode and the second electrode, the one or more nanostructures comprising silicon nanowires doped to a carrier density of at least about $10^{18}$ cm$^{-3}$, the silicon nanowires formed by electroless-etching in an aqueous solution of AgNO$_3$ and HF, wherein each nanowire has a rough surface, a diameter of from about 75 to 130 nm, a k of about 1.5 W·m$^{-1}$·K$^{-1}$ or less, and/or a ZT of about 0.8 or more at room temperature;
one or more thermal-electric structures located between the second electrode and the third electrode;
wherein:
the each of the one or more nanostructures is in contact with the first electrode and the second electrode;
the each of the one or more thermal-electric structures is in contact with the second electrode and the third electrode;
the each of the one or more nanostructures includes a surface associated with a first mean surface roughness, ranging from 1 nm to 5 nm.

* * * * *